(12) United States Patent
Levitsky et al.

(10) Patent No.: US 7,618,838 B2
(45) Date of Patent: Nov. 17, 2009

(54) HYBRID SOLAR CELLS BASED ON NANOSTRUCTURED SEMICONDUCTORS AND ORGANIC MATERIALS

(75) Inventors: Igor A. Levitsky, Fall River, MA (US); William B. Euler, Narragansett, RI (US); Natalya A. Tokranova, Cohoes, NY (US); Bai Xu, Slingerlands, NY (US); James Castracane, Albany, NY (US)

(73) Assignee: The Research Foundation of State University of New York, Albany, NY (US), part interest ( * ) Notice: Subject to any disclaimer, the term of this patent is extended or adjusted under 35 U.S.C. 154(b) by 366 days.

(21) Appl. No.: 11/410,796

(22) Filed: Apr. 25, 2006

(65) Prior Publication Data

US 2006/0263922 A1   Nov. 23, 2006

Related U.S. Application Data

(60) Provisional application No. 60/674,613, filed on Apr. 25, 2005.

(51) Int. Cl.
*H01L 51/48* (2006.01)
*H01L 31/00* (2006.01)

(52) U.S. Cl. ............ 438/82; 257/E31.13; 257/E51.015; 136/256; 136/263

(58) Field of Classification Search ......... 136/243–265; 438/57, 63, 82, 85–86, 99; 257/E31.13, E51.012–E51.017
See application file for complete search history.

(56) References Cited

U.S. PATENT DOCUMENTS 2,359,737 A * 10/1944 Lacey et al. ............... 540/139
4,125,414 A   11/1978 Tang et al. .................. 136/89
5,139,624 A *  8/1992 Searson et al. ............ 205/656
5,949,123 A    9/1999 Le et al. .................... 257/496
6,281,430 B1   8/2001 Lupo et al. ................. 136/263
6,653,701 B1  11/2003 Yamazaki et al. .......... 257/414
6,709,929 B2   3/2004 Zhang et al. ............... 438/268

(Continued)

OTHER PUBLICATIONS

Unal et al., "Photovoltaic effects from porous Si," J.Phys. D: Appl. Phys. 30, pp. 2763-2769, 7-pages, 1997.

(Continued)

*Primary Examiner*—Douglas M Menz
*Assistant Examiner*—Matthew W Such
(74) *Attorney, Agent, or Firm*—Heslin Rothenberg Farley & Mesiti, P.C.

(57) ABSTRACT

A method for forming a photovoltaic cell which includes forming a nanostructured layer in a semiconductor material having a plurality of pores opening onto a surface, the plurality of pores having a depth greater than about 1 micron and a diameter between about 5 nanometers and about 1,200 nanometers, and disposing an organic charge-transfer material in the pores of the nanostructured layer. A first electrode is attached to the semiconductor material, and a second electrode is attached to the organic charge-transfer material. The semiconductor material has a thickness between about 5 microns and about 700 microns. Desirably, the nanostructured layer has a porosity of less than the porosity corresponding to the percolation threshold, and the organic charge-transfer material extends at least about 100 nm from the surface of the nanostructured layer. The organic charge-transfer material may partially cover the sides of the pores of the nanostructured layer thereby providing a generally cylindrical cavity therein.

31 Claims, 7 Drawing Sheets

U.S. PATENT DOCUMENTS

| | | | |
|---|---|---|---|
| 6,946,597 B2 | 9/2005 | Sager et al. | 136/263 |
| 2001/0028872 A1 | 10/2001 | Iwasaki et al. | 423/447.3 |
| 2001/0036747 A1 | 11/2001 | Solanky et al. | 438/745 |
| 2003/0010971 A1 | 1/2003 | Zhang et al. | 257/15 |
| 2004/0084080 A1 | 5/2004 | Sager et al. | 136/263 |
| 2004/0144985 A1 | 7/2004 | Zhang et al. | 257/79 |
| 2005/0007648 A1 | 1/2005 | Wu et al. | 359/296 |
| 2005/0098204 A1* | 5/2005 | Roscheisen et al. | 136/263 |
| 2005/0098205 A1* | 5/2005 | Roscheisen et al. | 136/263 |
| 2005/0121068 A1* | 6/2005 | Sager et al. | 136/252 |
| 2005/0156180 A1 | 7/2005 | Zhang et al. | 257/79 |
| 2006/0070653 A1* | 4/2006 | Elrod et al. | 136/263 |

OTHER PUBLICATIONS

Aldrich, Chem Files, Organic Semiconductors for Advanced Electronics, vol. 4, No. 6, 16 pages, 2003.

V.M. Aroutiounian and M. Zh. Ghulinyan, "Electrical conductivity mechanisms in porous silicon" Phys. Stat. Sol. (a) 197, No. 2, p. 462-466, 2003.

* cited by examiner

HYBRID SOLAR CELLS BASED ON NANOSTRUCTURED SEMICONDUCTORS AND ORGANIC MATERIALS

CROSS-REFERENCE TO RELATED APPLICATION

This application claims the benefit of pending U.S. Provisional Application No. 60/674,613, filed on Apr. 25, 2005, entitled "Hybrid Solar Cells Based On Nanostructured Bulk Semiconductors And Organic Materials," the entire subject matter of which is incorporated herein by reference.

GOVERNMENT RIGHTS

This invention was made with Government support under National Science Foundation Grant No. DMI0338664. The Government has certain rights in the invention.

FIELD OF THE INVENTION

This invention relates to solar cells, and more particularly to the fabrication of solar cells based on nanostructured semiconductors and organic materials.

BACKGROUND OF THE INVENTION

Recent efforts have employed organic components for use in solar cells. Organic and composite photovoltaic cells have the advantages of being lightweight, cost-effective in processing, and can be deposited onto low-cost flexible substrates. This makes them extremely attractive for commercial applications in photovoltaic technologies.

For example, U.S. Pat. No. 6,946,597 issued to Sager et al. discloses a photovoltaic device which includes a porous template (aluminum oxide, titanium oxide, silicon oxide (SiO), other metal oxides, or other oxides) having an array of template pores. A first charge-transfer material (which may include cadmium selenide (CdSe), cadmium sulfide (CdS), cadmium telluride (CdTe). A second charge-transfer material such as an organic material fills additional space not occupied by the first charge-transfer material.

U.S. Pat. No. 6,281,430 issued to Lupo et al. discloses an photovoltaic device which includes forming columnar structures of a discotic liquid crystal material having interspaces defined between the columns of the discotic liquid crystal material, and filling the interspaces with a second material having electric properties different from that of the discotic liquid crystal material such as a low melting point amorphous phase n-type oxadiazole.

U.S. Patent Application Publication No. 2001/0036747 by Solanky et al. discloses forming porous silicon films for photovoltaic cells. The process includes electrochemical etching using an HF solution. A mechanical treatment may be employed to obtain lift-off of the low porosity layer and part of the high-porosity layer from the substrate. The mechanical treatment can be any of the known treatments such as ultrasonic treatment, pulling, etc. With the technique of formation and lift-off (separation) of thin film from the substrate, the remaining wafer (after removing thin layer) can be used again as starting product for manufacturing more thin films.

U.S. Pat. No. 6,653,701 issued to Yamazaki, et al. discloses solar cells having an inorganic semiconductor layer, a porous semiconductor layer, and an organic substance layer absorbed into the porous semiconductor layer. The inorganic semiconductor layer may be silicon, a compound semiconductor (GaAs), or a metal oxide. The porous semiconductor layer is preferably a metal oxide such as TiO2 (titanium oxide).

There is a need for further methods for fabricating solar cells based on nanostructured semiconductors and organic materials.

SUMMARY OF THE INVENTION

The present invention provides, in a first aspect, a method for forming a photovoltaic cell which includes providing a solid doped semiconductor material and forming a nanostructured layer in the semiconductor material having a plurality of pores opening onto a surface so that the plurality of pores have a depth greater than about 1 micron and a diameter between about 5 nanometers and about 1,200 nanometers. An organic charge-transfer material is provided and disposed in the pores of the nanostructured layer. The semiconductor material has a thickness between about 5 microns and about 700 microns. A first electrode is attached to the semiconductor material, and a second electrode is attached to the organic charge-transfer material.

The present invention provides, in a second aspect, a method for forming a photovoltaic cell in which the method includes providing a solid doped semiconductor material and forming a nanostructured layer in the semiconductor material having a plurality of pores opening onto a surface so that the plurality of pores having a depth greater than about 1 micron and a diameter between about 5 nanometers and about 1,200 nanometers, and which results in a porosity of the nanostructured layer less than the porosity corresponding to the percolation threshold. The nanostructured layer is separated from the semiconductor material. An organic charge-transfer material is provided and disposed in the pores of the nanostructured layer so that the organic charge-transfer material extends at least about 100 nm from the surface of the nanostructured layer. The nanostructured layer has a thickness between about 5 microns and about 200 microns. A first electrode is attached to the nanostructured layer, and a second electrode is attached to the organic charge-transfer material.

The present invention provides, in a third aspect, a method for forming a photovoltaic cell in which the method includes providing a flexible substrate, disposing a first electrode on the flexible substrate, disposing a solid doped semiconductor material on the first electrode. The solid doped semiconductor material has a nanostructured layer having a thickness between about 5 microns and about 50 microns, and a plurality of pores opening onto a surface of the nanostructured layer having a diameter between about 5 nanometers and about 1,200 nanometers. An organic charge-transfer material is provided and disposed in the pores of the nanostructured layer. A second electrode is attached to the organic charge-transfer material.

BRIEF DESCRIPTION OF THE DRAWINGS

The present matter which is regarded as the invention is particularly pointed out and distinctly claimed in the concluding portion of the specification. The present invention, however, may best be understood by reference to the following detailed description of various embodiments and the accompanying drawings in which:

DETAILED DESCRIPTION OF THE INVENTION

The present invention is directed to photovoltaic (PV) cells or solar cells generally fabricated from two components, a nanostructured doped semiconductor and an organic charge-transfer material, which results in enhancing the conversion efficiency and improved stability of the solar cells. In one embodiment described below, the combination of an organic component (protonated form of copper phthalocyanine) and an inorganic semiconductor (n-type porous silicon) results in both of the components being involved in the photovoltaics action as light absorbers and as charge transport materials. In addition, the light absorbance by porous silicon advantageously extends the spectral response to near infrared range. In comparison to the prior art solid Gratzel cells having a porous titania (TiO), the porous titania does not absorb the solar light. In addition, the porous silicon has considerably higher electron mobility than that of mesoporous titania (TiO).

Figure 1:
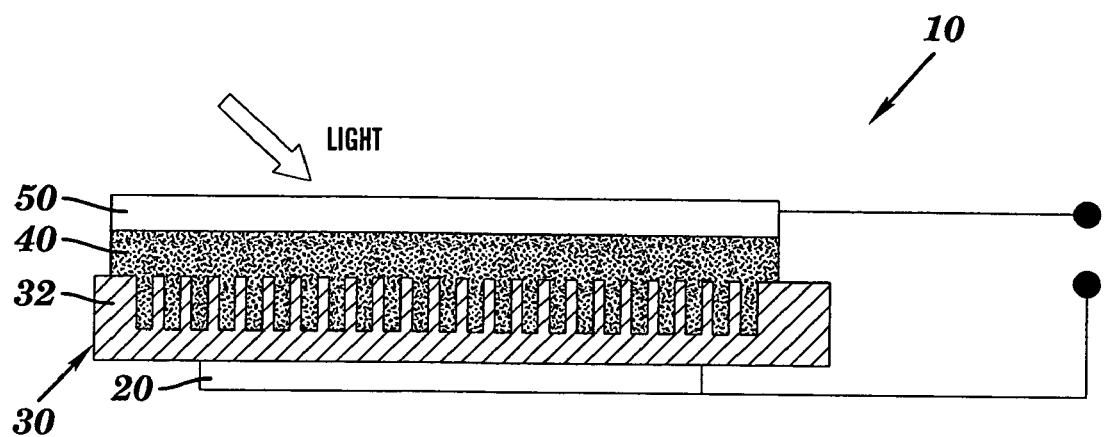
FIG. 1 is cross-sectional view of one embodiment of a nanostructured semiconductor photovoltaic device in accordance with the present invention.
Figure 2:
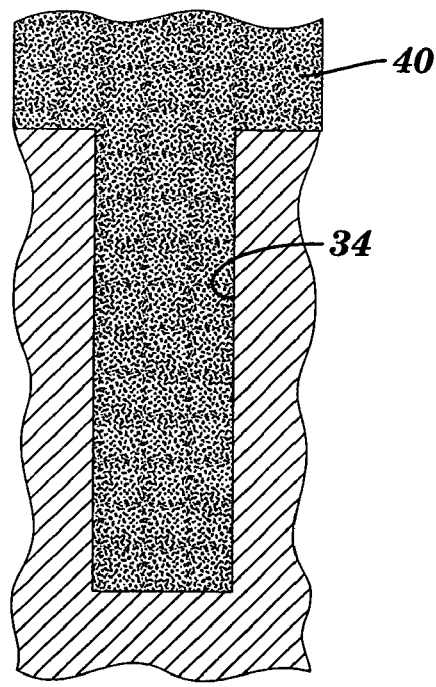
FIG. 2 is an enlarged, cross-sectional view of the pores of the nanostructured layer of the semiconductor material filled with the organic charge-transfer material of FIG. 1.

FIG. 1 illustrates one embodiment of a nanostructured semiconductor photovoltaic cell 10 in accordance with the present invention. For example, photovoltaic cell 10 may generally include an electrode 20, a porous nanostructured semiconductor material 30 having a nanostructured layer 32 formed therein, an organic charge-transfer material 40, and an electrode 50. Electrode 50 may be capped by a protective glass layer (not shown). FIG. 2 illustrates one embodiment of the organic material disposed inside one of the pores 34 of the nanostructured layer.

Semiconductor material 30 may be a doped semiconductor material. For example, doped semiconductor materials may include doped silicon (Si), doped gallium arsenide (GaAs), doped germanium (Ge), or doped gallium nitride (GaN). The semiconductor material may be doped to provide electron conductivity (n-type) or hole conductivity (p-type). The semiconductor material may include a doped single crystal Si semiconductor. It will be appreciated that other doped semiconductors may be employed.

In a first embodiment, a plurality of pores may be formed in semiconductor material 30 by electrochemical etching to form nanostructured layer 32. For example, the forming of the plurality of pores in the semiconductor material may include providing the semiconductor material defining an anode, providing an cathode, providing a hydrofluoric (HF) acid solution between the semiconductor material and the cathode, and applying a current between the semiconductor material and the cathode. The prepared porous surface may be treated by plasma etching using sulfur hexafluoride ($SF_6$) to increase the pore openings at the surface. For example, without such a plasma etching treatment, a fill factor is considerably lower resulting in decrease of the photovoltaic conversion efficiency. The pore diameter and spacing density may be controlled in a range of about 5 nanometers to about 1,200 nanometers by changing the electrochemical conditions such the electrolyte concentration and the applied current, as well as the semiconductor material. Further methods for electrochemical etching of silicon are disclosed in U.S. Patent Application Publication No. 2001/0036747 to Solanky et al., the entire subject matter of this patent application is incorporated herein by reference.

In a second embodiment, the semiconductors may be nanostructured by a nonlithographic method using a nanoporous anodized aluminum oxide (AAO). The AAO thin film disposed on the semiconductor surface acts as a mask under reactive ion etching. This method provides ordered lateral superlattice of nanopores onto the semiconductor surface with a diameter from tens to hundreds of nanometers. AAO film fabrication may be by a two-step electrochemical anodization process which includes aluminum anodization in oxalic acid and followed by a removal using a mixture of phosphoric acid and chromic acid.

Figure 3:
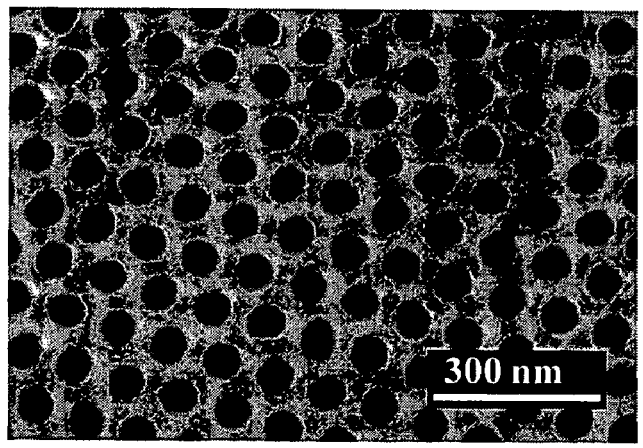
FIG. 3 is a Scanning Electron Microscopy (SEM) image of a surface of a self-organized anodized aluminum oxide (AAO) nanopore array matrix.

Such a method provides the highly uniform pore size and spacing over the entire film. The pore diameter and spacing density can be controlled in a range of about 20 nanometers to about 300 nanometers by changing the anodizing conditions such as the type of acid solution (usually 3-wt-percent to 5-wt-percent solution of phosphoric, oxalic, or sulfuric acids), temperature, and anodizing voltage or current. FIG. 3 is an SEM image of the front surface of a self-organized anodized aluminum oxide (AAO) nanopore array matrix.

AAO through-pore film is placed onto the semiconductor substrate directly from a rinsing solution (acetone/water) and allowed to dry providing tight contact with the semiconductor substrate. In the final step, the patterned substrate may be etched using plasma etching. Etching conditions depend on semiconductor substrate and the etching time to defined the pore depths. Thus, the ordered structure of the nanopore array can be fabricated in the semiconductor material.

In the present invention, the nanoporous semiconductors may be filled with organic compounds such as semiconductor polymers and dyes, which pose a high absorption coefficient and demonstrate an efficient photoinduce charge-transfer at the interface with the semiconductor. A condition for high light conversion, where the semiconductor is an n-type, is an organic charge-transfer material having an efficient p-type conductivity. Organic charge-transfer materials may include a Ru-complex, phthalocyanine derivatives, etc, or conjugated polymer with a high absorbance coefficient, efficient photo-induced charge-transfer and p-type conductivity.

Preferred candidates for this purpose is copper phthalocyanine and its derivatives including discotic liquid crystal (DLC) Cu-phthalocyanine (CuPC). For solid PV cell fabrication it is desired that the CuPC exhibits the DLC mesophase at room temperature or preserves it in the solid phase, and they are excellent electron-donor materials.

In one embodiment, the discotic liquid crystals (DLC) are embedded into the nanostructured layer of the semiconductor. The charge transport in the DLCs can be very fast due to the quasi-1D ordering of the columnar mesophase. The charge mobility in DLCs can be as high as ~0.1-1 cm2/Vs, three to four orders of magnitude higher than for most conjugated polymers. DLCs can be filled into nanoporous semiconductors forming the structure for charge separation and charge collection. In this case the nanopore diameter is comparable with the exciton diffusion length and its depth can be high enough to absorb all incidents light. Such a design may provide 100-percent light harvesting without exciton loss due to the remote interface area.

Various filling methods may be employed to entrap the organic materials inside nanostructured semiconductor such as hydraulic pressure, electrochemical deposition, vacuum pressure filling, soaking (impregnation), dripping, and spin casting. The filling method may be selected based on the molecular size (monomer/polymer), viscosity, and the semiconductor wetting agent chosen.

Since CuPC is not soluble in organic solvents, the CuPC solution was applied in a concentrated sulfuric acid to fill the porous silicon. In addition, sulfuric acid does not wet the porous silicon, therefore the pore filling should undergo an external driving force to move the solution inside the pores. For example, the CuPC solution was applied in concentrated sulfuric acid to fill the porous silicon by a coating and pressing method. After each step (3-5 times), the surface of the porous silicon was rinsed with deionized water.

The power conversion efficiency (PCE) value is dependent on the filling pressure. The best PCE of 3% was obtained for a relatively moderate pressure up to 7 kg/cm$^2$ therefore, it is expected that higher pressure may increase the cell efficiency. Indeed, SEM images revealed that organic material was deposited near-the surface region. This is supported by XPS analysis where the atomic concentration for Cu-2p3, N-1s and C-1s (all organic components) decreases exponentially as ~exp(–x/d) from the surface to the bulk with approximately the same d value of 80 nm to 100 nm for each atom. The trace of these atoms was clearly observed even at a depth of 200 nm. Thus, the pores are partially filled (for example for a 1.5 microns depth of porous Si layer the pore filling is about 10-percent at pressure 7.5 kg/cm$^2$) and higher pressure may improve the fill factor. However, a limit of increasing pressure may be due possible damage of the porous silicon to high mechanical load.

Figure 4:
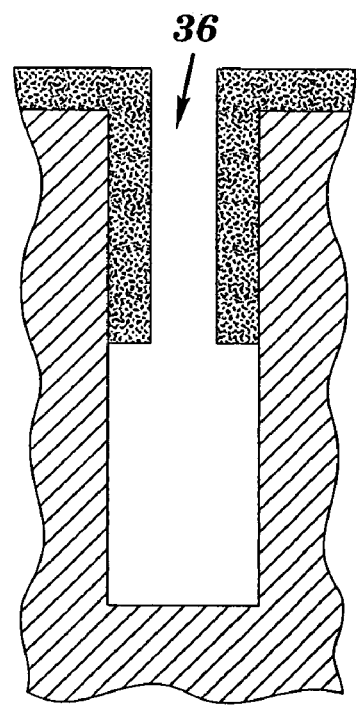
FIGS. 4 and 5 are enlarged, cross-sectional views of partially filled pores of a semiconductor material in accordance with the present invention.
Figure 5:
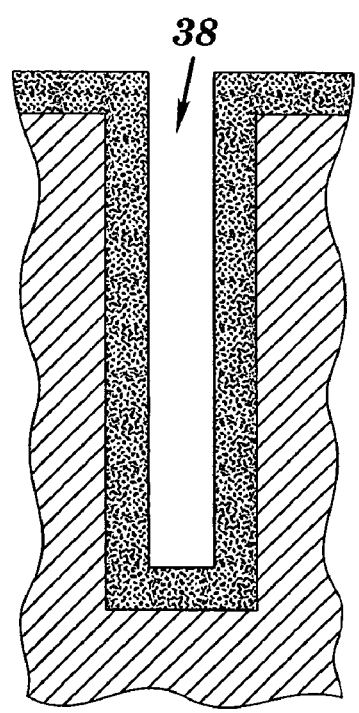

FIGS. 4 and 5 are enlarged cross-sectional views of partially filled pores. In particular, the organic charge-transfer material may partially fill the pores of the semiconductor material to form a cavity 36 (FIG. 4) or a generally cylindrical cavity therein 38 (FIG. 5). The cavity or air space may aid in the transfer or removal of heat from the photovoltaic cell, and thus, aid in inhibiting the degradation of the organic-transfer material.

Other methods may include the CuPC being evaporated onto the porous silicon in a vacuum (5×10^–6 torr) to form a film inside the pores of the nanostructured layer. Electrochemical deposition may also be used. For example, the CuPC in a sulfuric acid solution exists in the protonated form. Therefore, an electric field may be used as a driving force to move the CuPC cations into the nanopores. Another method for filling the pores with the organic material is based on the difference between the pressure inside the nanopores (vacuum) and pressure outside of the CuPC (normal pressure). In this method, the CuPC may be placed onto the porous silicon surface under a vacuum followed by a pressure increase.

A final step is the application of a transparent/semi-transparent electrode on to the organic material by evaporation of an ITO or thin metal layer.

Figure 6:
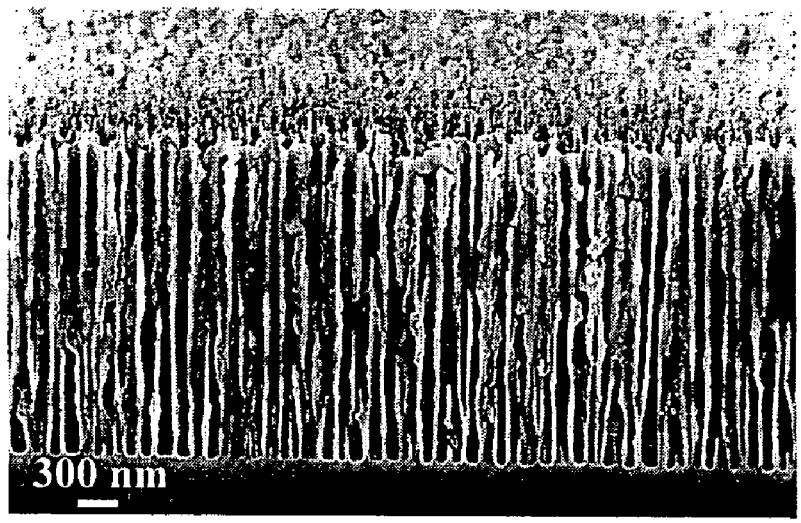
FIGS. 6 and 7 are SEM images of a cross-sectional view and a top view, respectively, of a porous silicon layer with 75-percent porosity.
Figure 7:
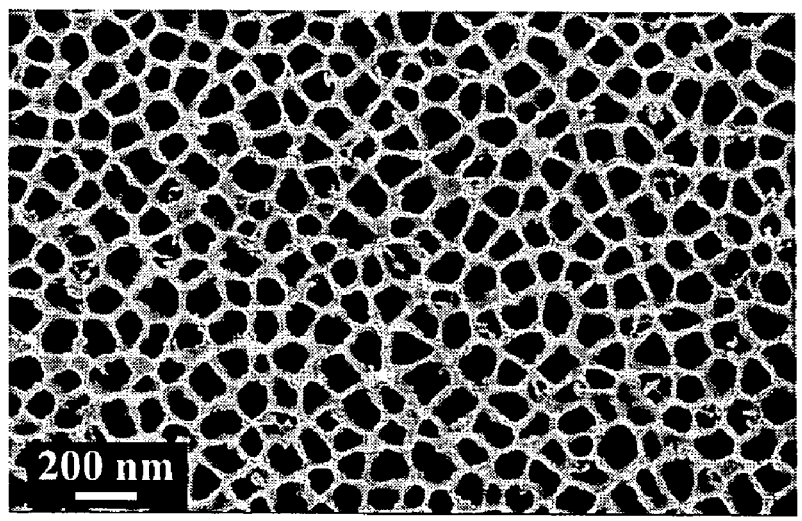
Figure 8:
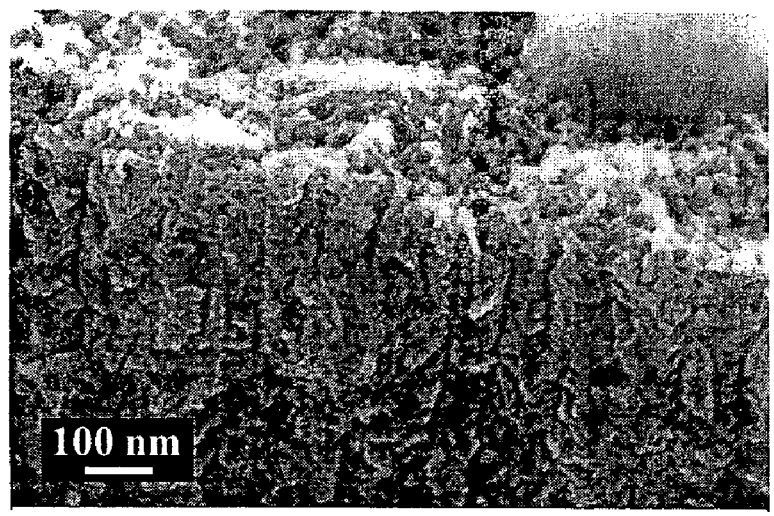
FIGS. 8 and 9 are SEM images of a cross-sectional view and a top view, respectively, of a porous silicon layer with 35-percent porosity.
Figure 9:
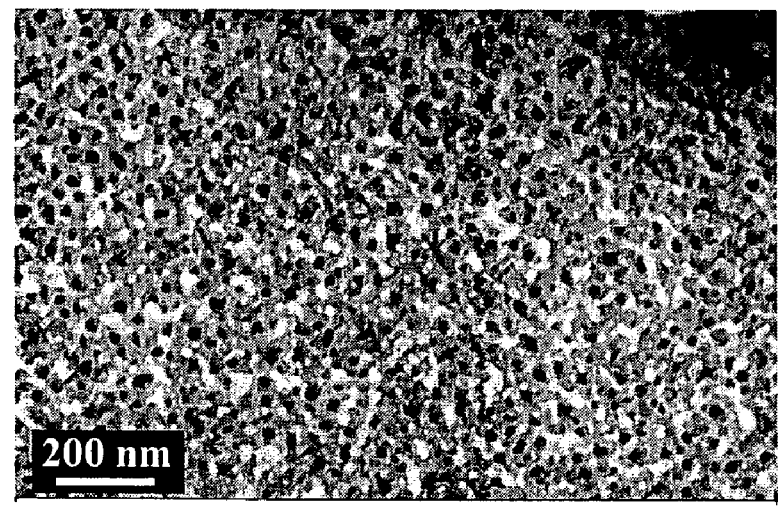

The porosity of the porous silicon is a factor affecting the performance of composite solar cells. It has been observed that a low porosity and thick porous silicon layer increases the PCE value compared to a high porosity and thin porous silicon layer. FIGS. 6 and 7 show SEM images of two porous silicon layers with porosity of 75-percent, and FIGS. 8 and 9 show SEM images of two porous silicon layers with porosity of 35-percent. The porous silicon layer having 75-percent porosity was produced in a 4-percent HF/ethanol solution at a 50 mA/cm$^2$ current density, and the porous silicon layer having 35-percent porosity was fabricated in a 15-percent HF/ethanol solution at 50 mA/cm$^2$.

The PCE of the high porosity sample (75-percent) was reduced by the factor of 10 to 15 with respect to the low porosity samples at the same reflectance of porous silicon layer. Likely this phenomenon is associated with an abrupt drop of the porous silicon conductivity at porosity values higher than 57-percent, percolation threshold for silicon, when hopping conductivity becomes dominate over the crystalline conductivity. Thus, an optimized structure of the porous silicon layer proposes a trade-off between a high conductivity and high porosity (large interface area which is favorable for charge separation).

Figure 10:
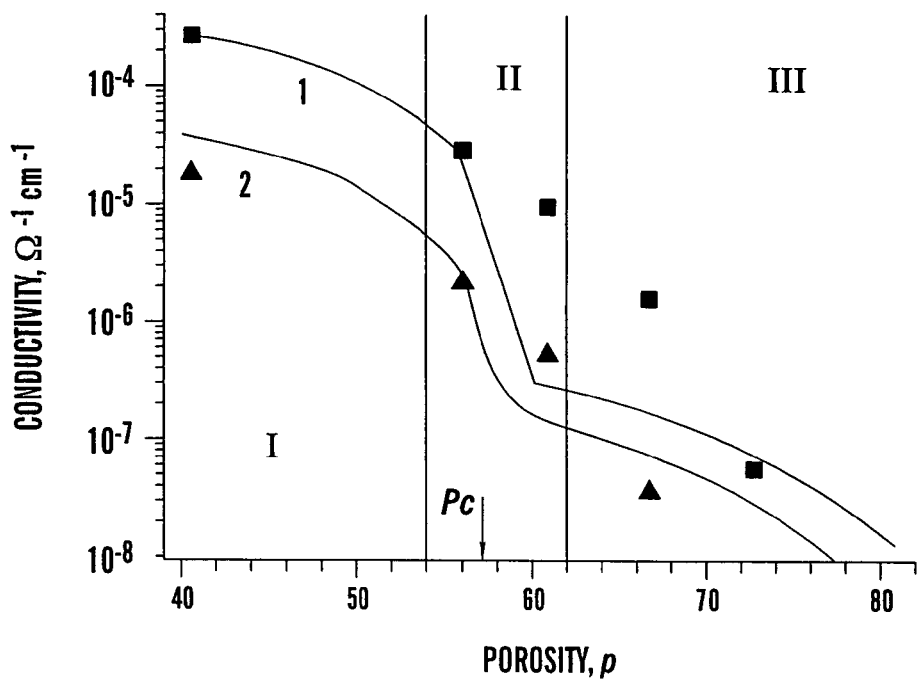
FIG. 10 is a graph of the dependence of porous silicon conductivity on material porosity.

For example, FIG. 10 illustrates the dependence of porous silicon conductivity on material porosity with area I being crystalline conductivity, area II being conductivity of fractal percolation cluster, and area III being hopping conductivity. See, V. M. Aroutiounian and M. Zh. Ghulinyan "Electrical conductivity mechanisms in porous silicon" Phys. Stat. Sol. (a) 197 (2), 2003, p. 462-466. Desirably, the porosity of nanostructured layer is between about 20-percent and about 40-percent.

The thickness of the porous silicon layer is also a factor affecting the performance of composite solar cells. It was found that the PCE increases with the depth of porous silicon layer as shown in FIG. 11 which is explained by the decrease of reflection for deeper porous silicon layers as shown in FIG. 12.

Figure 11:
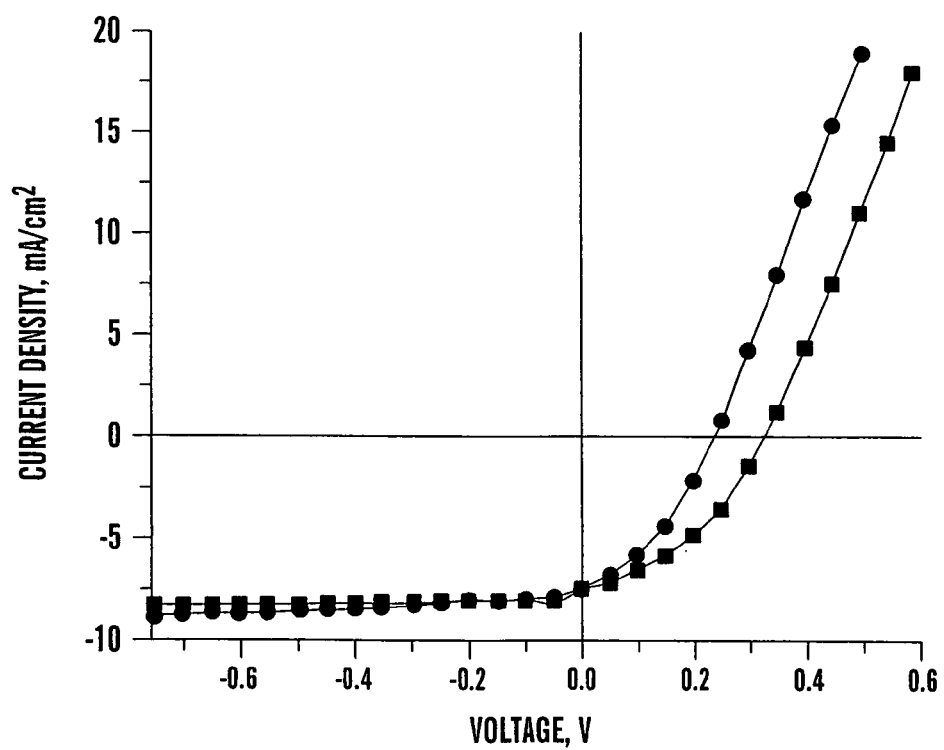
FIG. 11 is a graph of the voltage and current characteristics of solar cells having different thicknesses porous silicon layers.

As shown in FIG. 11, the characteristics of ITO/PSi-CuPC/Si/Cr/Au cells with different thicknesses of porous silicon layers at white light illumination (33 mW/cm$^2$) are illustrated. The porous silicon layer with a thickness of 1.8 microns resulted in $I_{sc}$=7.50 mA/cm$^2$, $V_{oc}$=0.237 V, FF=29%, η=1.6%. The porous silicon layer with a thickness of 12 microns resulted in $I_{sc}$=7.56 mA/cm$^2$, $V_{oc}$=0.325 V, FF=40%, η=3%. The source of white light was a 250 W halogen-tungsten lamp (QTH 6334, Oriel) equipped with a KG4 heat absorbing filter. Proximity to the standard solar simulator (class B) was estimated by the value of conversion efficiency of the calibrated silicon photodiode, which was less than 25-percent of National Renewable Energy Laboratory (NREL) data.

Figure 12:
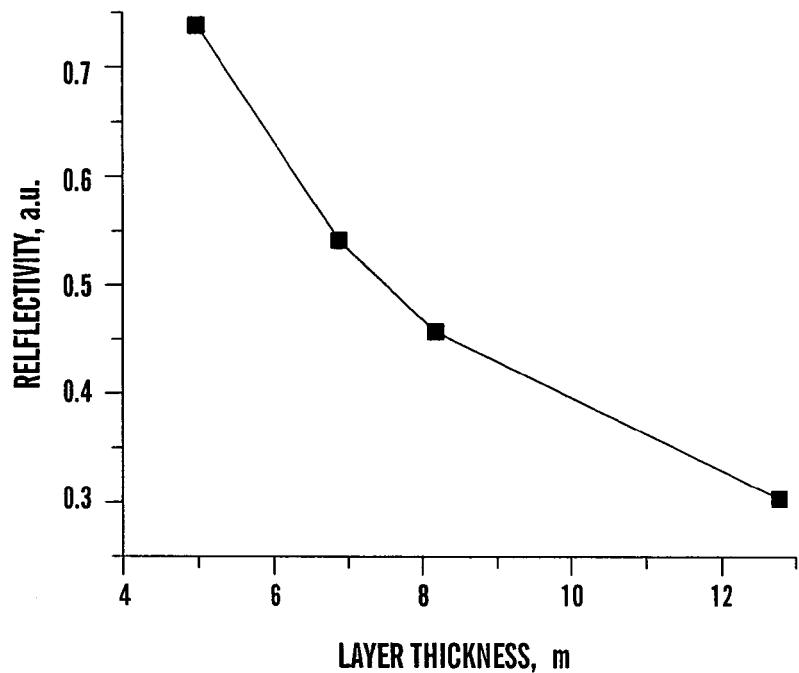
FIG. 12 is a graph of the reflectivity verses different thicknesses of porous silicon layering.

As shown in FIG. 12, reflectance decreased as thickness increased. In addition, the PCE increased from 1.6-percent to 3.0-percent with increasing the depth from 1.8 microns to 12 microns using the same filling procedure. Samples of silicon (n-type) were etched for different times under the same etch conditions (15-percent HF solution and current density of 55 mA/cm$^2$. The samples generally had a 35-percent porosity. A compromise between the low reflectivity and long pathway for the hole transport through the CuPC network inside the pores may be reached to provide the maximal efficiency. Thus, the thickness of the silicon layer is desirably greater than about 5 microns.

Similar to the photoinduced charge transfer (PCT) from the CuPC to the n-type Si, it was demonstrated that the same effect can be expected for Nickel-Phthalocyanine(NiPC) and Zinc-Phthalocyanine(ZnPC). It is expected that a more effective PCT may occur for ZnPC as a Zn atom is heavier than Cu.

Another option may be to fill the porous silicon with conjugated polymers. One possibility is the family of regioregular poly(thiophene)s which have been used in photovoltaics. Two possible methods of polymer infiltration inside the silicon pores include direct electrochemical growth of poly(3-methylthiophe) inside the porous silicon structure, and the other, spin coating of the polymer onto the porous silicon surface followed by heat-treating in the temperature range between 150 degrees C. and 200 degrees C. For example, poly (3-hexylthiophene) may be used which has often used in field-effect transistors due to its high hole mobility.

Additional improvement of photovoltaic action can be attained using a p-type conductor deposited into the silicon pores over the organic charge-transfer material. CuPC aggregates inside pores perform a dual function: absorb light and provide a pathway for holes migration to the external electrode. Due to imperfection in aggregate structure, hole transport may be slow, hence the pore filling with inorganic p-type conductor (over CuPC) may increase the hole diffusion resulting in better device performance. One such possibility may be to use copper iodide (CuI) and copper thiocyanate (CuSCN), which may be used as p-type conductor to fabricate solid dye synthesized solar cells (DSSC). By analogy with mesoporous titania, porous silicon may be filled with CuI/CuSCN from an acetonitrile solution. Molten salt (like 3-ethylmidazolium thiocyanate or similar) may be added to CuI solution to reduce the size of CuI nanocrystal and consequently increase p-type conductivity.

To produce freestanding porous nanostructured films, the resulting porous silicon layer may be removed from the substrate by applying a current density of 250-300 mA/cm$^2$ for 60 seconds in the same solution of HF with ethanol. However, it was determined that the existence of a highly porous layer at the bottom side of the porous Si film significantly suppressed electron conductivity resulting in poor photovoltal characteristics. To overcome this deficiency, a plasma etching may be applied to remove the highly porous layer. After removal of highly porous layer, it is expected that the PCE to be higher than that for wafer based solar cells. Vacuum pumping through the film facilitates the solvent infiltration inside the pores (for wafer based porous Si, vacuum pumping is not possible). However, the CuPC should not penetrate through all of the film thickness. An area of the pore void of the CuPC is desirably left at the bottom side to prevent the solar cell from shorting.

Figure 13:
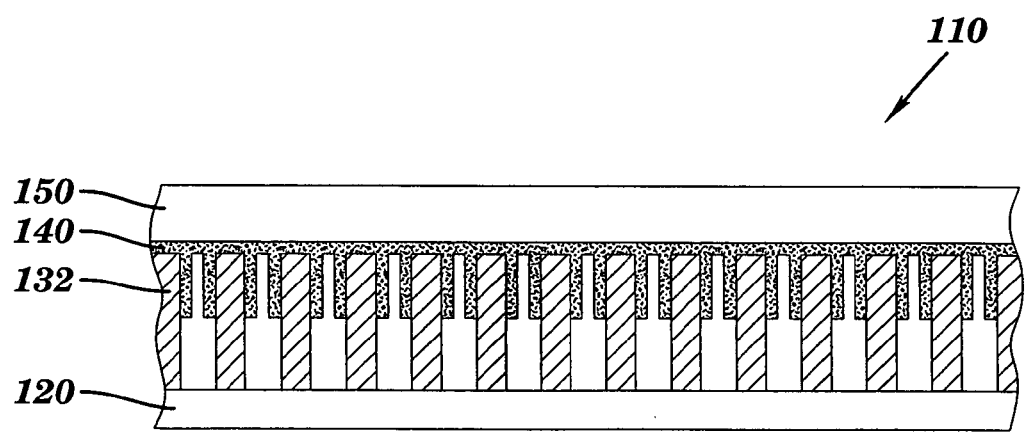
FIG. 13 is cross-sectional view of another embodiment of a nanostructured semiconductor photovoltaic device in accordance with the present invention.
Figure 14:
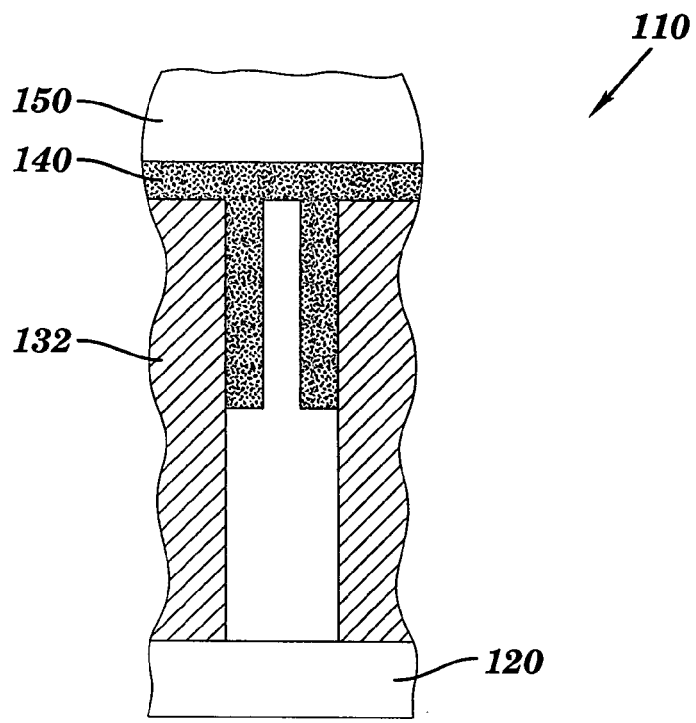
FIG. 14 is an enlarged, cross-sectional view of one of the pores of the nanostructured layer filled with the organic charge-transfer material of FIG. 13.

FIGS. 13 and 14 illustrate one embodiment of a nanostructured semiconductor photovoltaic cell 100 which incorporates a freestanding porous nanostructured film in accordance with the present invention. For example, photovoltaic cell 100 may generally include an electrode 120, a freestanding nanostructured layer 132, an organic charge-transfer material 140, and an electrode 150. Electrode 150 may be capped by a protective glass layer (not shown). FIG. 14 illustrates one embodiment of the organic material disposed inside one of the pores of the nanostructured layer 132.

Thin porous silicon films may be subsequently produced several times from the original doped semiconductor substrate. Such a method may reduce the cost of solar cells by reusing the same original wafer.

The optical and electrical properties of porous Si degrade with time, unless protective methods are taken. It is necessary to protect porous Si from ambient air by covering it with other layers to prevent degradation. Therefore, the filling procedure with CuPC and top contact formation can be considered not only as fabrication steps but also as a method of stabilizing of the porous silicon layer. During experiments, the porous Si/CuPC solar cells with an ITO sputtered electrode (80 nanometers) showed a slight decrease in PCE (about 90-percent of original value) after three months. In contrast, solar cells with gold (Au) contact (20 nanometers) degraded to a level of 10-percent of the initial PCE after only several days.

Poly(3,4-ethylenedioxythiophene)/poly(styrenesulfonate) or PEDOT/PSS polymer spin coat may be applied between the ITO and the CUPC. Usually this conducting polymer (Bayer product) is used in many organic devices to improve an interface area between organics and metal oxide electrodes. Thickness of the PEDOT layer may be varied by the polymer concentration.

In addition, semiconductor can be deposited onto a large-area polymer substrate and subsequently formed with a plurality of pores thereby making PV devices flexible and lightweight. This composite can be fabricated by cost-effective methods and deposited onto a large area flexible substrate making the photovoltaic device lightweight with a "roll-up" stowage configuration.

Figure 15:
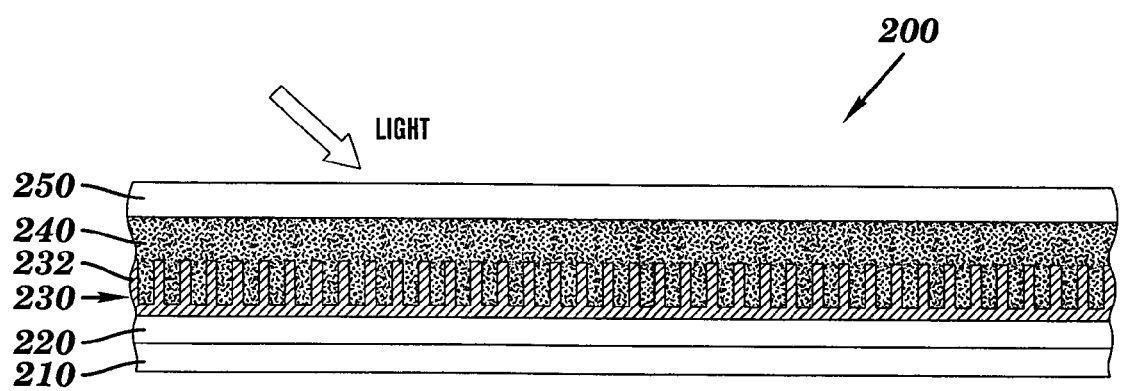
FIG. 15 is cross-sectional view of another embodiment of a nanostructured semiconductor photovoltaic device in accordance with the present invention.

For example, FIG. 15 illustrates another nanostructured semiconductor photovoltaic cell 200 in accordance with the present invention. Photovoltaic cell 200 may generally include a flexible substrate 210, an electrode 220, a semiconductor material 230 having a nanostructured layer 232, an organic charge-transfer material 240, and an electrode 250.

In forming nanostructured semiconductor photovoltaic cell 200, electrode 220 is deposited on flexible substrate 210. The porous nanostructured semiconductor material 230 such as a solid doped semiconductor material having a nanostructured layer is deposited or formed on first electrode 220. Organic charge-transfer material 240 is disposed in the pores of the semiconductor material, and electrode 250 is disposed on the organic charge-transfer material.

The materials for and the forming of the electrodes, porous nanostructured semiconductor material, and organic charge-transfer material may be as described above. For example, the nanostructured semiconductor material may have a thickness between about 5 microns and about 50 microns and a plurality of pores in the semiconductor material opening onto a surface of the semiconductor material, and the plurality of pores having a diameter between about 5 nanometers and about 1,200 nanometers.

The fabrication of the proposed solar cells is simple and cost effective. Organic/inorganic components (CuPC/Si) are inexpensive materials and electrochemical etching is a reliable method which does not require any special facilities like high vacuum deposition, lithography or clean rooms. Moreover, this method can be applied to fabricate stand alone thin Si films by reusing the same Si substrate that should considerably reduce the operational cost. In addition, such film-based solar cell can be prepared as a flexible, lightweight thin film if appropriate polymer filling is applied.

Although various embodiments have been depicted and described in detail herein, it will be apparent to those skilled in the relevant art that modifications, additions, substitutions and the like can be made without departing from the spirit of the present invention and these are, therefore, considered to be within the scope of the present invention as defined in the following claims.

The invention claimed is:

1. A method for forming a photovoltaic cell, the method comprising:

providing a nanostructured semiconductor layer having a thickness between about 5 microns and about 200 microns and having a plurality of pores opening onto a surface, the plurality of pores having a depth greater than about 1 micron and a diameter between about 5 nanometers and about 1,200 nanometers;

providing an organic charge-transfer material;

disposing the organic charge-transfer material in the pores of the nanostructured semiconductor layer;

operably attaching a first electrode to the nanostructured semiconductor layer; and attaching a second electrode to the organic charge-transfer material.

2. The method of claim 1 further comprising forming the nanostructured semiconductor layer having a porosity of the nanostructured semiconductor layer less than the porosity corresponding to the percolation threshold.

3. The method of claim 1 further comprising forming the nanostructured semiconductor layer having a porosity of the nanostructured semiconductor layer between about 20-percent and 40-percent.

4. The method of claim 1 wherein the disposing the organic charge-transfer material comprises disposing the organic charge-transfer material in the pores of the nanostructured semiconductor layer so that the organic charge-transfer material extends at least about 100 nanometers from the surface of the nanostructured semiconductor layer.

5. The method of claim 1 wherein the organic charge-transfer material partially fills the pores of the nanostructured semiconductor layer thereby providing the photovoltaic cell having a plurality of pores having a cavity.

6. The method of claim 1 wherein the organic charge-transfer material partially covers sides of the pores of the nanostructured semiconductor layer thereby providing a generally cylindrical cavity therein.

7. The method of claim 1 wherein the nanostructured semiconductor layer is formed on a single crystal doped silicon semiconductor.

8. The method of claim 1 wherein the nanostructured semiconductor layer comprises at least one of doped silicon, a doped gallium arsenide, a doped germanium, and a doped gallium nitride.

9. The method of claim 1 further comprising separating the nanostructured semiconductor layer from a semiconductor material.

10. The method of claim 1 wherein the providing the organic charge-transfer material comprises providing a polymer organic charge-transfer material.

11. The method of claim 1 wherein the providing the organic charge-transfer material comprises providing a liquid organic charge-transfer material.

12. The method of claim 1 wherein the disposing the organic charge-transfer material comprises applying the organic charge-transfer material to the nanostructured semiconductor layer and pressing the organic charge-transfer material into the pores of the nanostructured semiconductor layer.

13. The method of claim 1 wherein the disposing the organic charge-transfer material comprises applying the organic charge-transfer material to the surface of the nanostructured semiconductor layer under a vacuum.

14. The method of claim 1 wherein the providing the organic charge-transfer material comprises providing a copper phthalocyanine (CuPc) in a sulfuric acid solution, and the disposing the organic charge-transfer material comprises disposing the copper phthalocyanine (CuPc) in the sulfuric acid solution in the pores of the nanostructured semiconductor layer.

15. The method of claim 1 wherein the providing the organic charge-transfer material comprises providing copper phthalocyanine (CuPc), and the disposing the organic charge-transfer material comprises evaporating the copper phthalocyanine (CuPc) or the depositing the copper phthalocyanine (CuPc) in the pores of the nanostructured semiconductor layer under a vacuum.

16. The method of claim 1 wherein the providing the organic charge-transfer material comprises providing a material selected from the group comprising a Ruthenium-complex, a phthalocyanine derivatives, a copper phthalocyanine (CuPc), and a discotic liquid crystal copper phthalocyanine (CuPc).

17. The method of claim 1 wherein the nanostructured semiconductor layer comprises an n-type electron conductivity, and the organic charge-transfer material comprises a p-type hole conductivity.

18. The method of claim 1 wherein the nanostructured semiconductor layer comprises a p-type hole conductivity, and the organic charge-transfer material comprises an n-type electron conductivity.

19. The method of claim 1 further comprising forming the nanostructured semiconductor layer using an electrochemical etching process.

20. The method of claim 1 further comprising forming the nanostructured semiconductor layer comprises providing a semiconductor material defining an anode, providing an cathode, providing a hydrofluoric acid solution between the semiconductor material and the cathode, and applying a current between the semiconductor material and the cathode.

21. The method of claim 1 further comprising forming the nanostructured semiconductor layer comprises using an anodized aluminum oxide layer disposed on the surface of a semiconductor material and plasma etching.

22. The method of claim 1 wherein a porosity of the nanostructured semiconductor layer comprises less than the porosity corresponding to the percolation threshold, and wherein the organic charge-transfer material extends at least about 100 nanometers from the surface of the nanostructured semiconductor layer.

23. The method of claim 22 wherein the organic charge-transfer material partially fills the pores of the nanostructured semiconductor layer thereby providing the photovoltaic cell having a plurality of pores having a cavity.

24. The method of claim 1 further comprising providing a substrate, and disposing at least one of the first electrode and the second electrode on the substrate.

25. The method of claim 24 wherein the substrate comprises a flexible substrate.

26. The method of claim 24 wherein the nanostructured semiconductor layer has a thickness between about 5 microns and about 50 microns.

27. The method of claim 1 wherein a porosity of the nanostructured semiconductor layer comprises about less than 57-percent, and the organic charge-transfer material extends about 100 nanometers from the surface of the nanostructured semiconductor layer.

28. The method of claim 1 wherein the nanostructured semiconductor layer has a thickness between about 5 microns and about 50 microns.

29. The method of claim 1 wherein a porosity of the nanostructured semiconductor layer comprises less than about 57-percent.

30. The method of claim 1 wherein the nanostructured semiconductor layer and the organic charge-transfer material comprise n-type electron conductivity and p-type hole conductivity.

31. A method for forming a photovoltaic cell, the method consisting of:

providing a nanostructured semiconductor layer having a thickness between about 5 microns and about 200 microns and having a plurality of pores opening onto a surface, the plurality of pores having a depth greater than about 1 micron and a diameter between about 5 nanometers and about 1,200 nanometers;

providing an organic charge-transfer material;

disposing the organic charge-transfer material in the pores of the nanostructured semiconductor layer;

operably attaching a first electrode to the nanostructured semiconductor layer; and attaching a second electrode to the organic charge-transfer material.

* * * * *